(12) United States Patent
Esposito

(10) Patent No.: US 7,932,761 B1
(45) Date of Patent: Apr. 26, 2011

(54) FINE TUNED PULSE WIDTH MODULATION

(75) Inventor: Benjamin Esposito, Pittsboro, NC (US)

(73) Assignee: Altera Corporation, San Jose, CA (US)

( * ) Notice: Subject to any disclaimer, the term of this patent is extended or adjusted under 35 U.S.C. 154(b) by 53 days.

(21) Appl. No.: 12/368,264

(22) Filed: Feb. 9, 2009

(51) Int. Cl.
*H03K 3/017* (2006.01)

(52) U.S. Cl. ......................... 327/175; 327/172

(58) Field of Classification Search ................ None
See application file for complete search history.

(56) References Cited

U.S. PATENT DOCUMENTS

| | | | | |
|---|---|---|---|---|
| 5,587,709 A * | 12/1996 | Jeong | ............................. | 341/100 |
| 5,623,497 A * | 4/1997 | Shimawaki et al. | ............ | 714/704 |
| 2006/0279440 A1 * | 12/2006 | Zhao et al. | ........................ | 341/67 |
| 2007/0097069 A1 * | 5/2007 | Kurokawa et al. | ............ | 345/102 |

* cited by examiner

*Primary Examiner* — Cassandra Cox
(74) *Attorney, Agent, or Firm* — Martine Penilla & Gencarella, LLP

(57) ABSTRACT

Techniques and an apparatus for producing pulse width modulation (PWM) edges are described. A PWM controller circuit with a polyphase counter is described. The polyphase counter may comprise a plurality of counters. Each of the counters may be set to a specific initial count value. A polyphase decoder block with a plurality of sets of high/low decoders are coupled to outputs from the polyphase counter. A set/reset block with a plurality of set/reset logic elements is coupled to outputs from the polyphase decoder block. A serializer is coupled to outputs from the plurality of set/reset blocks to generate PWM edges. Multiple parallel phases of a PWM pulse may be created with the circuit. Using a polyphase counter and comparator to create multiple parallel phases may speed up the controller circuit and provide a finer tuning resolution.

20 Claims, 8 Drawing Sheets

FINE TUNED PULSE WIDTH MODULATION

BACKGROUND

Modulation is the alteration or modification of a carrier wave by another wave or signal. The amplitude and phase angle or frequency of the carrier wave may be modulated. Pulse-width modulation (PWM) is a type of pulse-time modulation (PTM) in which the time of occurrences of the leading edge or the trailing edge is varied from its unmodulated position. Wave samples are used to vary the time of occurrences of some parameters of the pulses. PWM uses a square wave whose duty cycle is modulated by changing the widths of pulses and information is encoded in the width of pulses.

PWM edges are typically created with a counter and comparator circuit that decodes counter values to set and reset a flip flop. The modulation of the PWM edges is limited by the clock rate at which the counter and comparator run at. A faster clock rate will provide more accurate modulation of PWM edges, which will in turn provide finer control of a device. The challenge in designing PWM circuits is then to minimize the time period that can be used for modulating the PWM edges as the tuning resolution is directly proportional to the clock rate of the circuit.

PWM may be used to control mechanical devices like electronic stepper motors where the motors are used in applications that require accurate positioning. These devices would generally benefit from finer controls. Therefore, it is highly desirable to have a PWM circuit with a faster clock rate in order to enhance the accuracy of any application or device that uses such modulation. It is in this context that embodiments of the present invention arise.

SUMMARY

Embodiments of the present invention include methods and an apparatus for fine tuning a pulse width modulation (PWM).

It should be appreciated that the present invention can be implemented in numerous ways, such as a process, an apparatus, a system, a device or a method on a computer readable medium. Several inventive embodiments of the present invention are described below.

In one embodiment, a PWM controller is disclosed. The PWM controller has a polyphase counter with a plurality of outputs. In some embodiments, the counters are modulo-N counters. A polyphase decoder block with a plurality of sets of high/low comparators is coupled to the outputs from the polyphase counter. A set/reset block with a plurality of set/reset logic elements is coupled to the outputs from the polyphase decoder block. The outputs from the plurality of set/reset blocks are coupled to a serializer.

In another embodiment, a method of generating a waveform is provided. The method comprises generating N-number of outputs with N-number of counters. The outputs generated by the counters are transmitted to N sets of first and second comparators that compare each output to a set of high and low values respectively. N number of parallel signals are created by setting or resetting N number of set/reset logic elements based on outputs from each corresponding first and second comparators. The N parallel signals are then converted into a serial stream. In some embodiments, the serial stream is transmitted to a low-voltage differential signaling (LVDS) circuit.

In yet another embodiment, a method of providing a fine tuned PWM is disclosed. The method includes generating N outputs in parallel with N counters. In one embodiment, each of the N counters is set to a specific initial count value. N parallel phases are created by comparing an output from each of the N counters to a set of values using N sets of comparators. In some embodiments, each set of comparators comprises a high comparator and a low comparator comparing an output from one of the N counters with a set of high and low values respectively. The N parallel phases are serialized using a high speed serializer.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe methods and an apparatus for fine tuning Pulse Width Modulation (PWM) edges.

It will be obvious, however, to one skilled in the art, that the present invention may be practiced without some or all of these specific details. In other instances, well-known operations have not been described in detail in order not to unnecessarily obscure the present invention.

Embodiments described herein provide techniques for fine tuning PWM edges. PWM edges are derived at N times the normal clock rate by separating the counter and comparator circuits into N parallel phases, where N is a positive integer. In an exemplary embodiment, N parallel counters are used to count N values in parallel. These N parallel counters feed into N parallel comparators. The N comparators create N parallel phases. A serializer is used to serialize the N parallel phases from the comparators. The serialized output can be sent as a low-voltage differential signaling (LVDS) signal via an LVDS circuit. The tuning resolution in some embodiments is limited by the LVDS data rates and not the normal clock rate.

Therefore, in some of these embodiments, the tuning resolution is significantly smaller than a typical circuit which is limited by the clock rate of the counter and the comparator.

Figure 1:
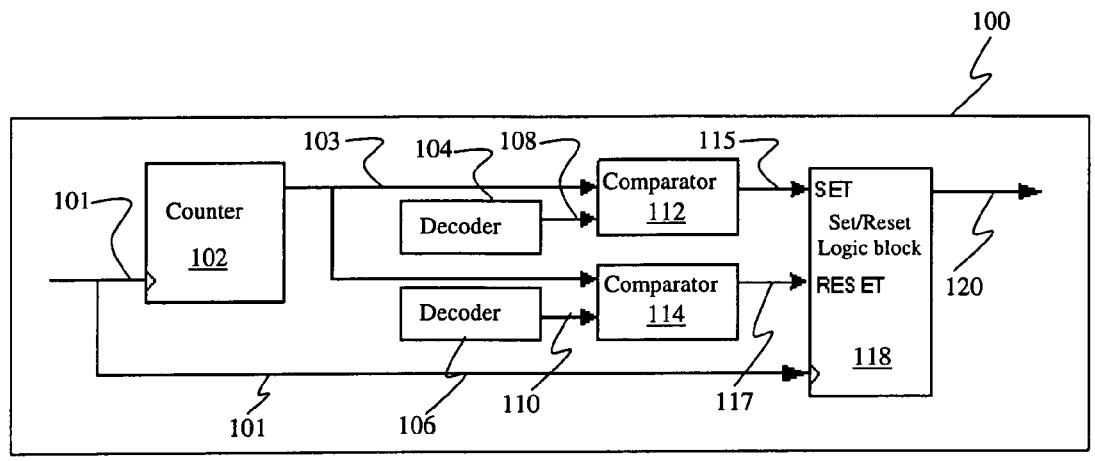
FIG. 1, as an illustrative example, shows a circuit 100 used to generate a PWM.

FIG. 1, as an illustrative example, shows a circuit 100 used to generate a PWM. A counter 102 is coupled to two comparators 112 and 114. The counter 102 receives a clock input 101. The speed of the counter 102 and the two comparators 112 and 114 is limited by the clock rate of the clock input 101. On every pulse of the clock input 101, the output value 103 from the counter 102 is incremented or decremented to form a series of signals having an overall triangular ramp shape. For example, the counter 102 may be initialized to 0 and the counter 102 will count up from 0 at every clock edge of the clock input 101 until the output value 103 reaches the maximum count value of the counter 102. When the output value 103 is at the maximum count value, the counter 102 begins counting down from the maximum count value until the output value 103 reaches 0 before the counter 102 starts counting up again.

The two comparators 112 and 114 coupled to the counter 102 determine when the high and low decoder values are reached. The comparators 112 and 114 change state when the output value 103 from the counter 102 equals the value of the decoders 104 and 106 at the inputs 108 and 110 of the comparators 112 and 114, respectively. For example, when the output value 103 from the counter 102 equals the value from the decoder 104, the comparator 112 will output a logic high value. Otherwise, the comparator 112 will output a logic low value. Similarly, the comparator 114 outputs a logic high value when the output value 103 from the counter 102 equals the value of the decoder 106 and outputs a logic low value when the output value 103 does not equal the value of the decoder 106. The comparators 112 and 114 are coupled to a set/reset logic block 118. An input 115 of the set/reset logic block 118 is coupled to the output of the comparator 112 and another input 117 of the set/reset logic block 118 is coupled to the output of the comparator 114. The input 115 sets the set/reset logic block 118 and the input 117 resets the set/reset logic block 118 based on the outputs from the comparators 112 and 114, respectively. Therefore, the comparators 112 and 114 control the set/reset logic block 118 that provides a PWM pulse as an output 120.

Figure 2A:
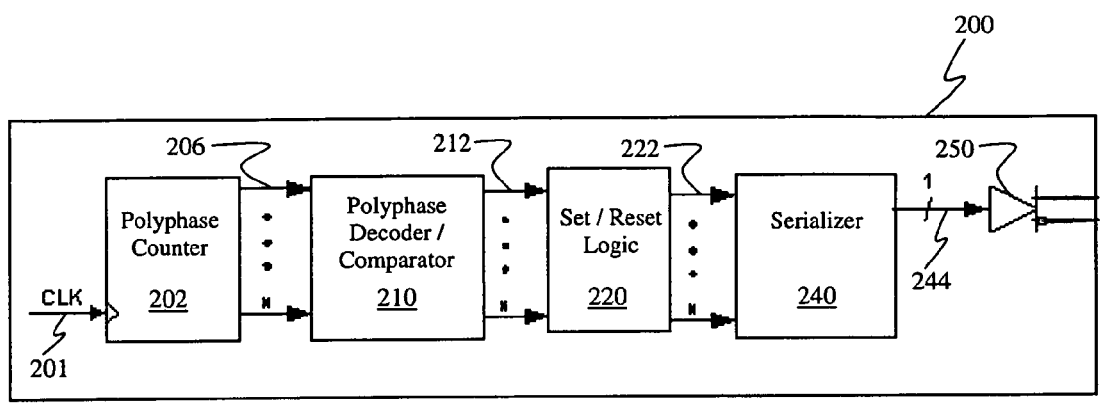
FIG. 2A, meant to be illustrative and not limiting, shows a polyphase circuit 200 as an embodiment of the present invention.

FIG. 2A, meant to be illustrative and not limiting, shows a polyphase circuit 200 as an embodiment of the present invention. A polyphase counter 202 is coupled to a polyphase decoder/comparator 210. The polyphase counter 202 produces N outputs 206. In one embodiment, N is an integer greater than 1 and the polyphase counter 202 produces N different outputs at each clock cycle. The N outputs 206 from the polyphase counter 202 feed into the polyphase decoder/comparator block 210. In one embodiment, there is a set of high/low decoders and N sets of comparators in the polyphase decoder/comparator block 210.

The polyphase decoder/comparator block 210 produces N outputs 212. The N outputs 212 from the polyphase decoder/comparator block 210 generate N phases operating in parallel, resulting in a circuit running at the equivalent output rate of N times the clock rate supplied by the clock input 201. All the N outputs 212 are fed into a set/reset logic block 220. In one embodiment, the set/reset logic block 220 includes N flip flops, or other suitable storage elements, and each of the outputs 212 of the polyphase decoder/comparator block 210 either sets or resets each corresponding flip flop. The set/reset logic block 220 produces N outputs 222. The N outputs 222 are coupled to a serializer 240. In an exemplary embodiment, the serializer 240 is a high speed serializer that serializes the N outputs 222. In an exemplary embodiment, the serialized output 244 sent, via a dedicated high speed LVDS buffer 250, as an LVDS signal. In one embodiment, the circuit 200 is configured using logic cells in a programmable logic device (PLD).

Figure 2B:
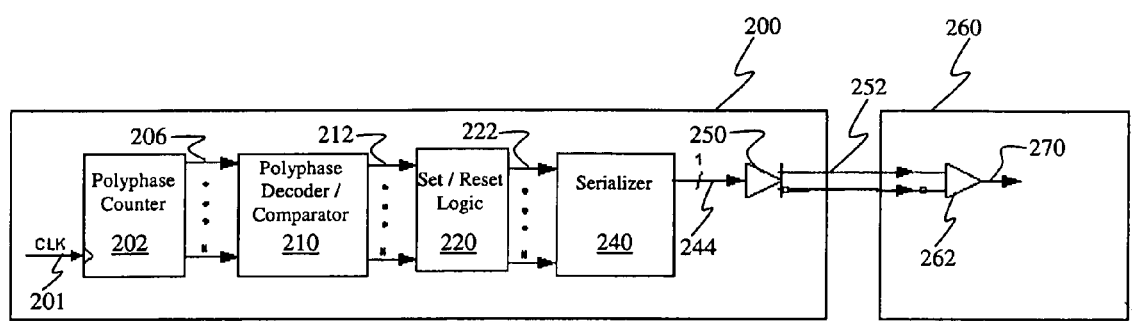
FIG. 2B, meant to be illustrative and not restrictive, shows the polyphase circuit 200 coupled to an LVDS input buffer 262 in another circuit 260 as an exemplary embodiment of the present invention.

FIG. 2B, meant to be illustrative and not restrictive, shows the polyphase circuit 200 coupled to an LVDS input buffer 262 in another circuit 260 as an exemplary embodiment of the present invention. In some embodiments, the circuit 260 is configured in an external device coupled to the circuit 200 and the LVDS signal from the dedicated high speed LVDS 250 is sent to the circuit 260 via external routing 252. In other embodiments, the circuit 260 is configured in the same device as the circuit 200. The LVDS buffer 262 produces a PWM waveform as an output 270. In one embodiment, the tuning resolution of the PWM is determined by the LVDS serial data rate. For the sake of brevity, the polyphase counter 202, polyphase decoder/comparator 210, set/reset logic block 220 and serializer 240 in circuit 200 are described in reference to FIG. 2A and are not repeated here.

Figure 3A:
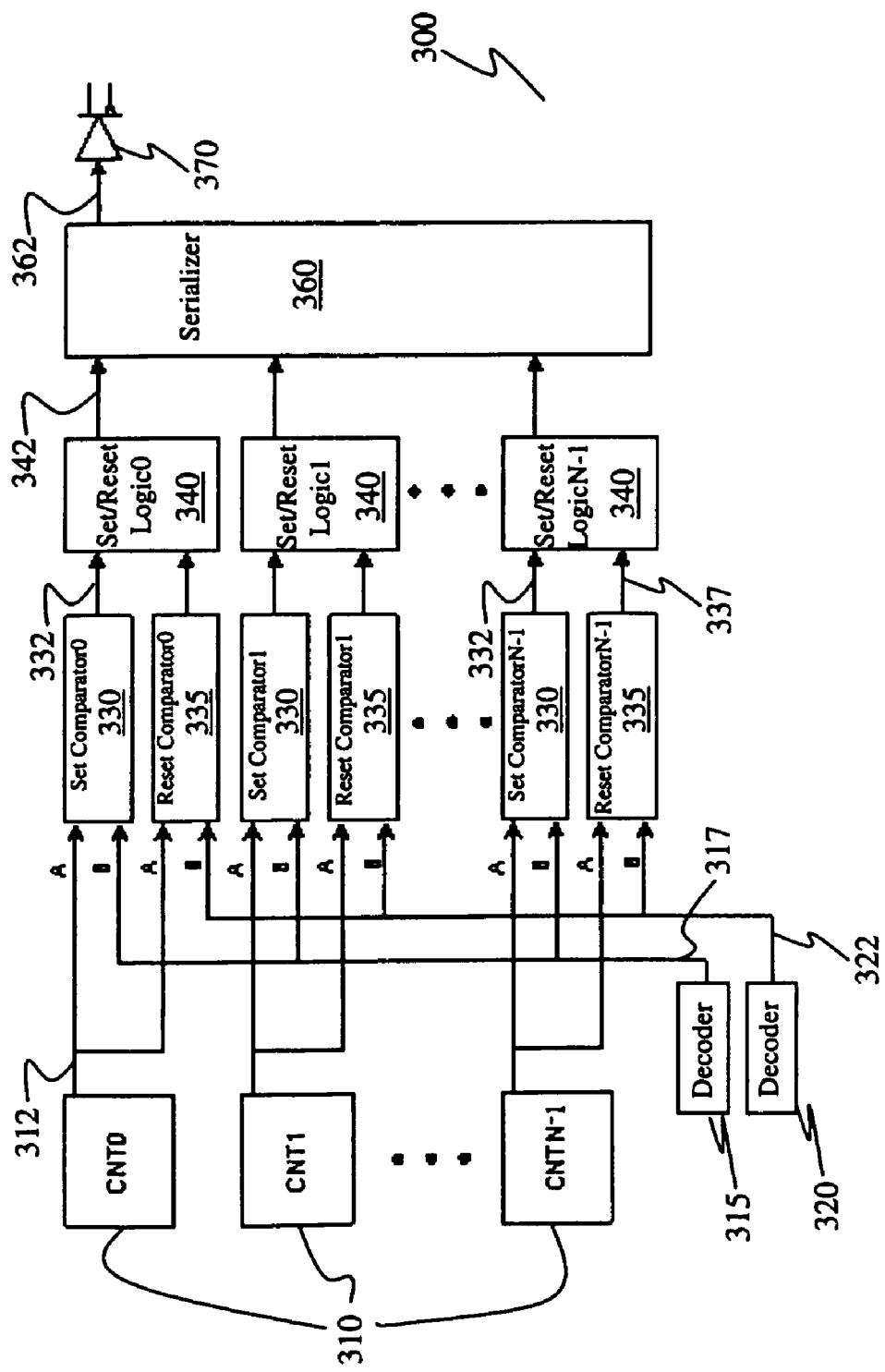
FIG. 3A, meant to be illustrative and not limiting, shows an example circuit 300 used to generate a fine tuned PWM waveform.

FIG. 3A, meant to be illustrative and not limiting, shows an example circuit 300 used to generate a fine tuned PWM waveform. In the circuit 300, N number of counters 310 are connected to N sets of set comparators 330 and reset comparators 335. In one embodiment, the counters (CNT0-CNTN-1) 310 are of modulo N type. In such an embodiment, upon initialization, CNT0 is set to 0, CNT1 is set to 1 and CNTN-1 is set to N-1. In some embodiments, the N number of counters provide N different sequential counts in parallel. In the illustrated embodiment, there is N number of set comparators 330 and N number of reset comparators 335. Each of the N number of set comparators 330 compares a corresponding input from one of the counters 310 with an input from the decoder 315 coupled to each of the N number of set comparators 330. Likewise, each of the N number of reset comparators 335 compares a corresponding input from one of the counters 310 with an input from the decoder 320 coupled to each of the N number of reset comparators 335.

In one embodiment, each of the comparators 330 and 335 determines if the first input A is greater than or equal to the second input B. One skilled in the art should note that additional logic necessary for clearing the comparators has been left out in order to not obscure the present invention. The outputs of the comparators 330 and 335 are coupled to an N number of set/reset logic blocks 340. In some embodiments, the outputs 332 set the set/reset logic blocks 340 based on the outputs of the set comparators 330 and the outputs 337 reset the set/reset logic blocks 340 based on the outputs of the reset comparators 335. The outputs 342 of the set/reset logic blocks 340 are coupled to a serializer 360. In one embodiment, the serializer 360 has N inputs and each of the outputs 342 from each of the set/reset logic blocks 340 is coupled to an input of the serializer 360. The serializer 360 converts the signals from the set/reset logic blocks 340 into a serial stream 362. In some embodiments, the clock rate of the serial stream 362 is N times faster than the system clock rate. As an illustrative example, eight counters with a clock rate of 100 MHz would be running at an equivalent clock rate of 800 MHz (8×100 MHz) because the 8 counters provide 8 different counts in parallel. The serial stream 362 is transmitted to a buffer 370. In one embodiment, the buffer 370 is an LVDS buffer.

Figure 3B:
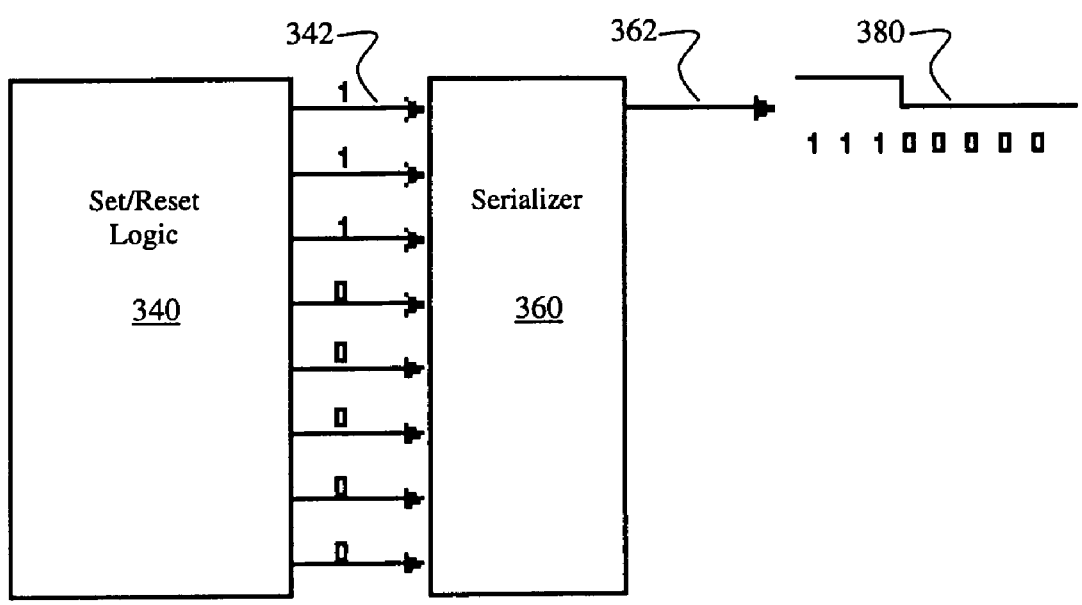
FIG. 3B, meant to be illustrative and not limiting, shows the serializer 300 with the serial stream 362 generating an example PWM edge 380.

FIG. 3B, meant to be illustrative and not limiting, shows the serializer 360 with the serial stream 362 generating an example PWM edge 380. The serializer 360 generates an example PWM edge 380 based on the outputs 342 from the set/reset logic blocks 340. The PWM edge 380 and the value of each of the outputs 342 are meant to be illustrative and not limiting. Even though only a few outputs 342 from the set/ reset block 340 are shown in FIG. 3B, one skilled in the art should appreciate that any number of storage elements can be used in the set/reset block 340, e.g., flip flops, latches, etc., to generate a desired number of outputs.

Figure 4:
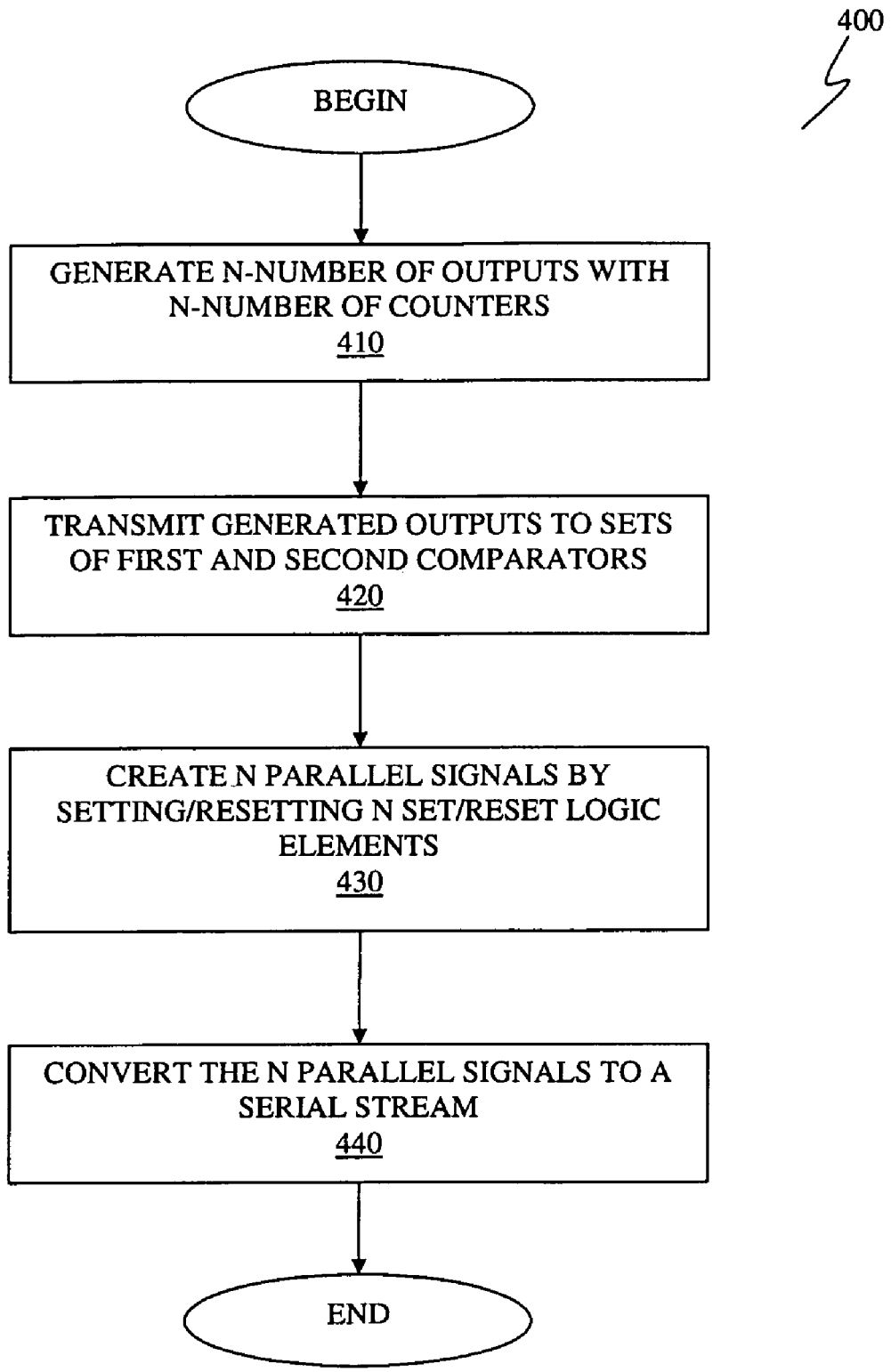
FIG. 4, meant to be illustrative and not limiting, is a simplified flow chart 400 showing method operations to generate a PWM waveform as another embodiment of the present invention.

FIG. 4, meant to be illustrative and not limiting, is a simplified flow chart 400 showing method operations to generate a PWM waveform as another embodiment of the present invention. N-number of outputs are generated with N-number of counters in operation 410. In some embodiments, each of the counters is initialized to a different count value. In some of these embodiments, the count value ranges from 0 to one less than the total number of counters used. For example, if a total of 10 counters are used, the first counter would be initialized to 0, the second counter would be initialized to 1, subsequent counters would be initialized to a different value sequentially and the last counter would be initialized to 9.

The outputs generated by the counters are transmitted to N sets of first and second comparators in operation 420 and each set of comparators compares an output from the counters to a set of high and low values. In one embodiment, the counters and the comparators are similar to the counters 310 and comparators 330 and 335 in FIG. 3A. N parallel signals are created by setting or resetting N set/reset logic elements in operation 430. As an exemplary embodiment, the outputs from the comparators set and reset the N-number of set/reset flip flops similar to the set/reset block 340 in FIG. 3A. The plurality of parallel signals is converted to a serial stream in operation 440. In one embodiment, the plurality of signals is serialized using a serializer.

Figure 5:
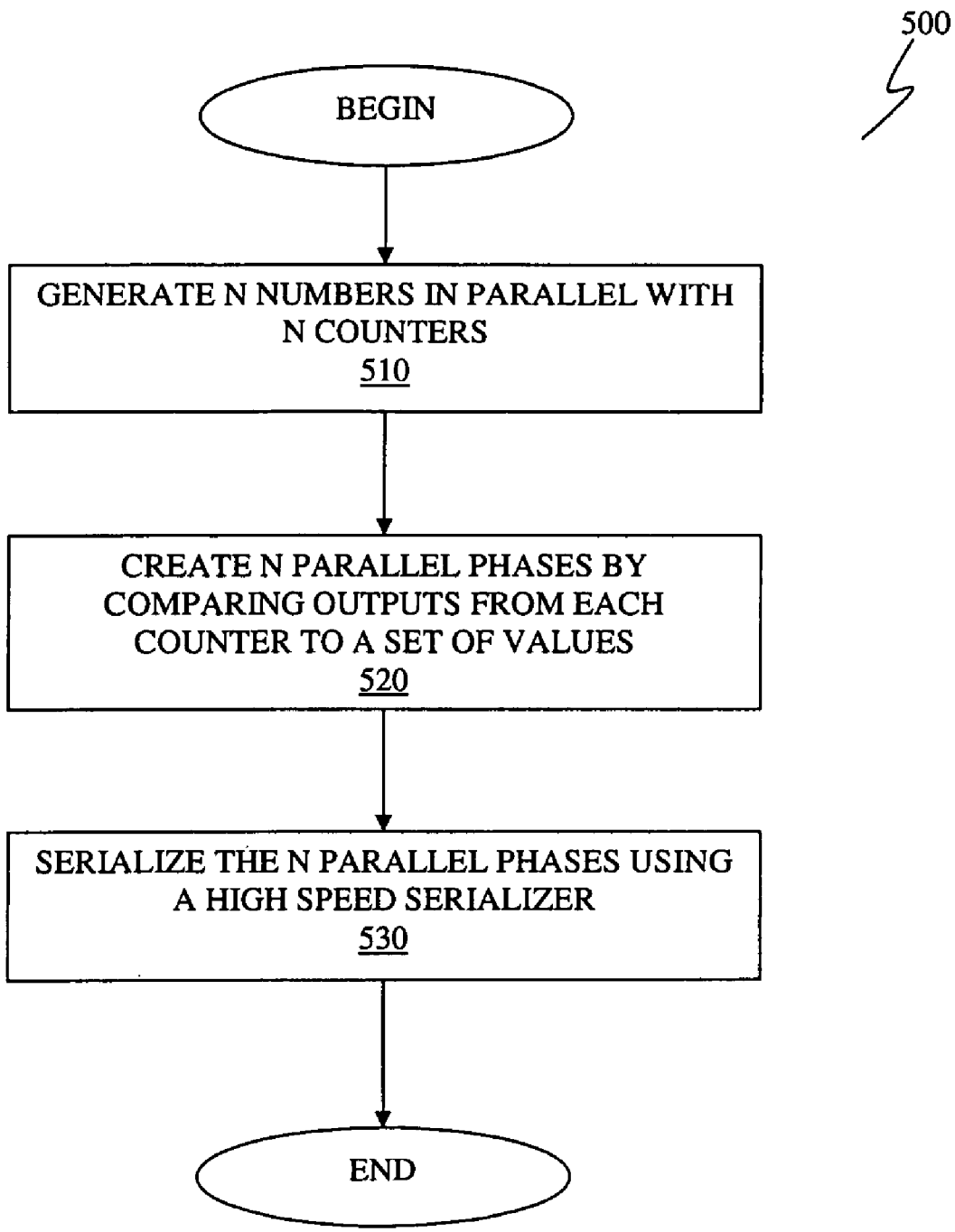
FIG. 5, meant to be illustrative and not limiting, shows a method flow 500 to create a fine tuned PWM as one embodiment in accordance with the present invention.

FIG. 5, meant to be illustrative and not limiting, shows a method flow 500 to create a fine tuned PWM as one embodiment in accordance with the present invention. N numbers, i.e. N positive integers, are generated with N counters in operation 510. In some embodiments, the numbers generated range from 0 to N-1 where N is the total number of counters used in operation 510. N parallel phases are created in operation 520 by comparing an output from each of the N counters to a set of values using N sets of comparators. In one embodiment, each of the N sets of comparators includes a high comparator and a low comparator. The high comparator compares one of the outputs from the counters to a set of high values and the low comparator compares the same output to a set of low values.

In one embodiment, the high comparator is similar to the set comparator 330 in FIG. 3A that compares an output from one of the counters to a set of values from the decoder 315. Similarly, the low comparator may be the reset comparator 335 in FIG. 3A that compares the same output to another set of values from the decoder 320. The N parallel phases produced in operation 520 are serialized with a high speed serializer in operation 530. In an exemplary embodiment, using N counters and N sets of comparators to create N parallel phases is equivalent to deriving PWM edges at N times the clock rate of a single counter. In some embodiments, the serialized output from operation 530 is transmitted to an LVDS circuit. In some of these embodiments, the tuning resolution of the PWM is determined by the data rate of the LVDS circuit used in operation 530. In other embodiments, the tuning resolution is directly proportional to the clock rate. Therefore, a higher clock rate or a faster LVDS rate provides a higher tuning resolution for the generated PWM edges.

Figure 6:
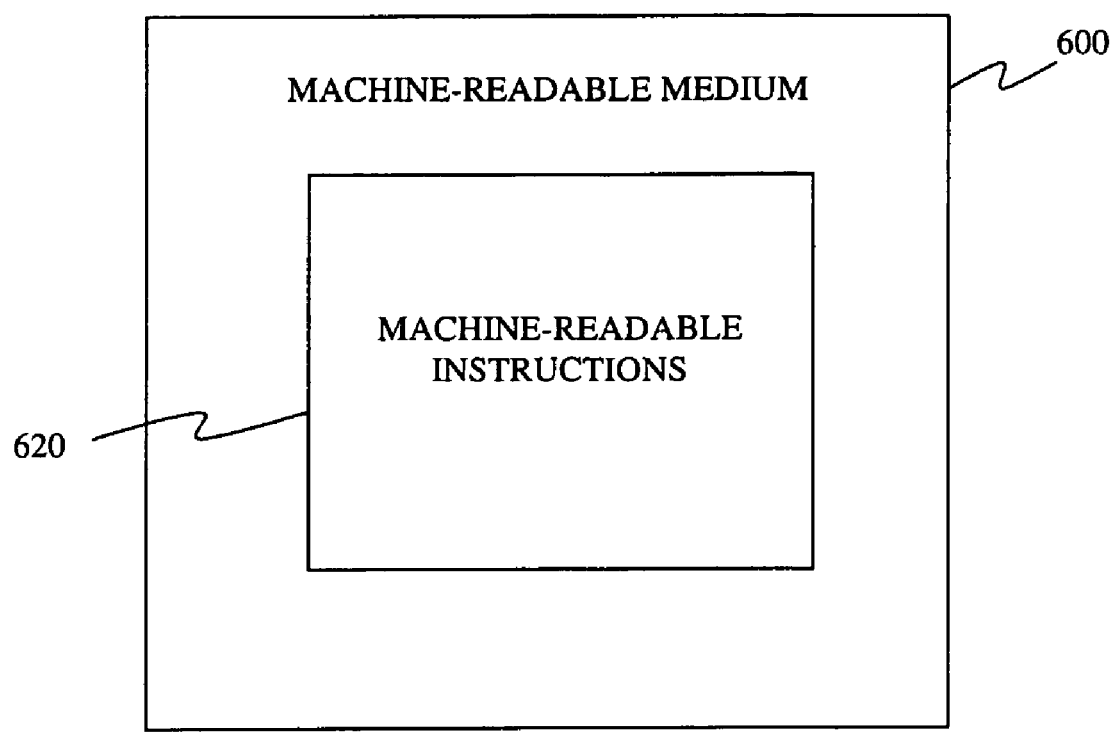
FIG. 6 is a simplified block diagram of an illustrative machine-readable medium in accordance with a possible aspect of the present invention.

FIG. 6 illustrates another possible aspect of the invention. The machine-readable medium 600 is any tangible data storage device that can store data, which can thereafter be read by a machine or a computer system. Illustrative examples of the machine-readable medium 600 include hard drives, network attached storage (NAS), read-only memory, random-access memory, CDs, DVDs, USB drives, volatile and non-volatile memory, and other optical and non-optical data storage devices. The machine-readable medium 600 can also be distributed over a network-coupled computer system so that the machine-readable instructions 620 is stored and executed in a distributed fashion. The machine-readable instructions 620, when executed, can at least partly perform one or more methods in accordance with the present invention.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be any of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A pulse width modulation (PWM) controller circuit, comprising:
 a polyphase counter with a plurality of outputs;
 a polyphase decoder block with a plurality of sets of high/low comparators, wherein the polyphase decoder block is coupled to the outputs from the polyphase counter;
 a set/reset block with a plurality of set/reset logic elements coupled to outputs of the polyphase decoder block; and
 a serializer coupled to outputs of the set/reset block, the serializer converting the outputs of the set/reset block to a serial data stream having a clock rate faster than a system clock of the PWM controller circuit.

2. The PWM controller circuit of claim 1, wherein the polyphase counter comprises:
 an N number of counters, and wherein the counters are modulo-N counters.

3. The PWM controller circuit of claim 2, wherein the controller runs at an N-times faster clock rate than a single counter clock rate, wherein N is a positive integer.

4. The PWM controller circuit of claim 1, wherein the outputs of the polyphase counter comprise a plurality of different count values.

5. The PWM controller circuit of claim 1, wherein the polyphase decoder block comprises:
   an N-number of a first type of comparators; and
   an N-number of a second type of comparators.

6. The PWM controller of claim 5, wherein each of the first type of comparators compares an output of the polyphase counter with a first value and each of the second type of comparators compares an output of the polyphase counter with a second value.

7. The PWM controller of claim 5, wherein outputs from the first type of comparators set the set/reset block and outputs from the second type of comparators reset the set/reset block.

8. A programmable logic device (PLD) comprising the PWM controller circuit of claim 1, wherein the PWM controller circuit is configured in the PLD using logic cells of the PLD.

9. The PWM controller of claim 1, further comprising:
   a low-voltage differential signaling (LVDS) circuit coupled to an output of the serializer.

10. The PWM controller of claim 1, wherein the set/reset block comprises an N number of set/reset flip flops, wherein N is a positive integer.

11. A method of generating a waveform, comprising:
    generating N-number of outputs with a N-number of counters;
    transmitting the N-number of outputs generated by the N-number of counters to N sets of first and second comparators, wherein each set of the comparators compare an output from the counters to a set of high and low values;
    creating an N-number of parallel signals by one of setting or resetting an N number of set/reset logic elements wherein each of the set/reset logic elements is set or reset based on an output from one of the first and second comparators set; and
    converting the N-number of parallel signals to a serial stream, the serial stream functioning as a clock signal.

12. The method of claim 11, wherein the converting is done using a high speed serializer.

13. The method of claim 11, further comprising:
    transmitting the serial stream to a circuit.

14. The method of claim 13, wherein the circuit comprises a low-voltage differential signaling (LVDS) buffer circuit.

15. The method of claim 11, wherein the N-number of counters produce edges on the waveform at a clock rate N times faster than a system clock rate and wherein N is a positive integer.

16. A method of providing a fine tuned pulse width modulation (PWM), comprising:
    generating N outputs in parallel with N counters, wherein N is a positive integer;
    creating N parallel phases by comparing an output from each of the N counters to a set of values using N sets of comparators; and
    serializing the N parallel phases using a high speed serializer.

17. The method of claim 16, further comprising:
    transmitting an output of the high speed serializer to an LVDS circuit.

18. The method of claim 17, wherein a tuning resolution of the PWM is determined by a data rate of the LVDS circuit.

19. The method of claim 16, wherein each of the N counters is set to a different initial count value, and wherein an initial count value ranges from 0 to N-1.

20. A machine-readable medium encoded with machine-readable instructions for performing the method defined in claim 16.

* * * * *